(12) United States Patent
Takeuchi (10) Patent No.: US 10,790,256 B2
(45) Date of Patent: Sep. 29, 2020

(54) WIRING BOARD AND SEMICONDUCTOR DEVICE

(71) Applicant: SHINKO ELECTRIC INDUSTRIES CO., LTD., Nagano (JP)

(72) Inventor: Hirofumi Takeuchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/354,472

(22) Filed: Mar. 15, 2019

(65) Prior Publication Data
US 2019/0312003 A1   Oct. 10, 2019

(30) Foreign Application Priority Data
Apr. 5, 2018   (JP) .................................. 2018-072937

(51) Int. Cl.
| | | |
|---|---|---|
| H01L 23/00 | (2006.01) | |
| H01L 23/31 | (2006.01) | |
| H01L 23/538 | (2006.01) | |
| H01L 21/56 | (2006.01) | |
| H01L 21/48 | (2006.01) | |

(52) U.S. Cl.
CPC .......... *H01L 24/20* (2013.01); *H01L 21/4853* (2013.01); *H01L 21/565* (2013.01); *H01L 23/3128* (2013.01); *H01L 23/5386* (2013.01); *H01L 23/5389* (2013.01); *H01L 24/19* (2013.01); *H01L 2224/214* (2013.01)

(58) Field of Classification Search
CPC ...................................................... H01L 24/20
USPC ......................................................... 257/668
See application file for complete search history.

(56) References Cited

U.S. PATENT DOCUMENTS

2008/0236662 A1*  10/2008  Ichikawa ............. H01G 9/2068
136/256

FOREIGN PATENT DOCUMENTS

JP        2014-033067        2/2014

* cited by examiner

*Primary Examiner* — Jami Valentine Miller
(74) *Attorney, Agent, or Firm* — IPUSA, PLLC (57) ABSTRACT

A wiring board includes an insulator layer, and a connection terminal having a first surface and a side surface intersecting the first surface. The first surface is exposed from the insulator layer, and the insulator layer includes a gap formed along at least a part of the side surface.

9 Claims, 7 Drawing Sheets

WIRING BOARD AND SEMICONDUCTOR DEVICE

CROSS-REFERENCE TO RELATED APPLICATION

This application is based upon and claims priority to Japanese Patent Application No. 2018-072937, filed on Apr. 5, 2018, the entire contents of which are incorporated herein by reference.

FIELD

Certain aspects of the embodiments discussed herein are related to a wiring board, a semiconductor device, and a method of manufacturing the wiring board.

BACKGROUND

When manufacturing a wiring board, a solder resist layer is formed to cover conductive pads, openings exposing the conductive pads are formed in the solder resist layer, and conductive posts are formed to project through the openings. In addition, when manufacturing a semiconductor device by mounting an electronic component such as a semiconductor chip or the like, solder balls or the like are used to bond the conductive posts to conductive pads of the electronic component.

For example, Japanese Laid-Open Patent Publication No. 2014-33067 proposes an example of a semiconductor chip and a semiconductor device.

Recently, there are demands to further shrink the semiconductor device and the wiring board. However, it is difficult to shrink the conventional wiring board while maintaining satisfactory conductivity and mechanical strength.

SUMMARY

Accordingly, it is an object in one aspect of the embodiments to provide a wiring board, a semiconductor device, and a method of manufacturing the wiring board, which can shrink the wiring board and the semiconductor device while maintaining satisfactory conductivity and mechanical strength.

According to one aspect of the embodiments, a wiring board includes an insulator layer; and a connection terminal having a first surface, and a side surface intersecting the first surface, wherein the first surface is exposed from the insulator layer, and the insulator layer includes a gap formed along at least a part of the side surface.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Preferred embodiments of the present invention will be described with reference to the accompanying drawings. In the drawings, those parts that are the same are designated by the same reference numerals, and a repeated description of the same parts may be omitted.

A description will now be given of the wiring board, the semiconductor device, and the method of manufacturing the wiring board, in each embodiment according to the present invention.

First Embodiment

A first embodiment will be described. The first embodiment relates to the wiring board.

[Structure of Wiring Board]

Figure 1A:
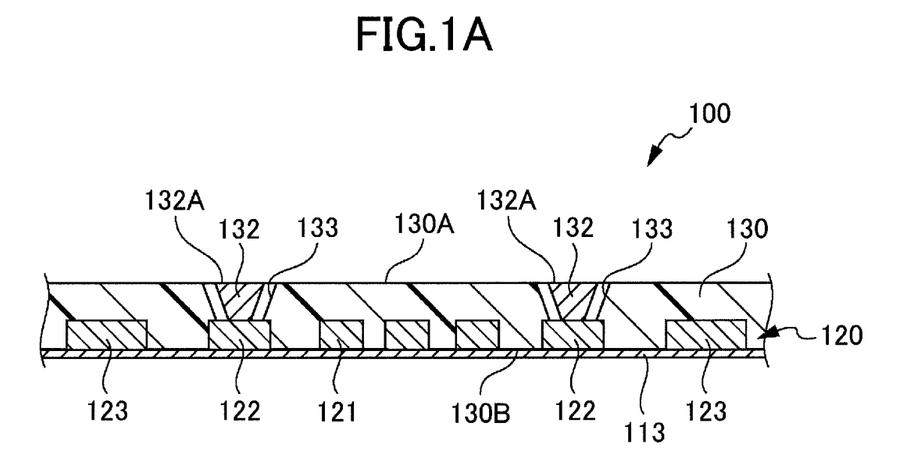
FIG. 1A and FIG. 1B are diagrams illustrating a wiring board in a first embodiment.
Figure 1B:
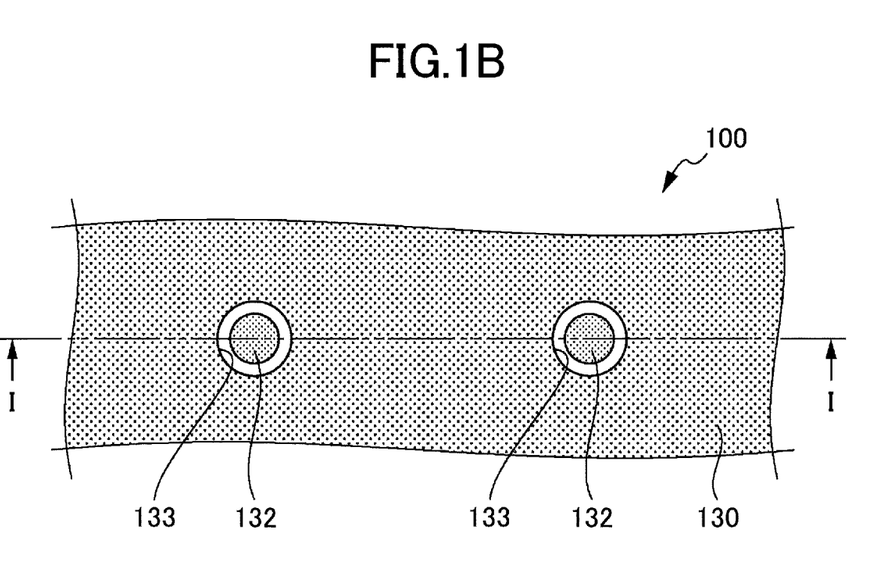

First, a structure of the wiring board will be described. FIG. 1A and FIG. 1B are diagrams illustrating the wiring board in the first embodiment. FIG. 1A is a cross sectional view of a wiring board 100, and FIG. 1B is a plan view of the wiring board 100. FIG. 1A corresponds to the cross sectional view along a line I-I in FIG. 1B.

As illustrated in FIG. 1A and FIG. 1B, the wiring board 100 in the first embodiment includes a conductor layer 120, an insulator layer 130, connection terminals 132, and a thin foil 113. The connection terminal 132 has a first surface 132A, and a side surface intersecting the first surface 132A, and the first surface 132A is exposed from the insulator layer 130. Gaps (or spaces) 133 are formed in the insulator layer 130, along the side surface of the connection terminals 132.

For example, a thermosetting non-photosensitive resin that includes an epoxy resin, an imide resin, a phenol resin, a cyanate resin, or the like as a main component thereof, may be used as a material forming the insulator layer 130. For example, a thermosetting photosensitive resin that includes an epoxy resin, a phenol resin, a synthetic rubber, or the like as the main component thereof, may also be used as the material forming the insulator layer 130. For example, copper (Cu) posts may be used as the connection terminals 132.

The conductor layer 120 is provided within the insulator layer 130, and is connected to the connection terminals 132. The conductor layer 120 includes micro wirings 121 and conductive pads 123, in addition to connecting parts 122 connected to the connection terminals 132. For example, the connecting parts 122 and the conductive pads 123 are electrically connected via the micro wirings 121.

The first surface 132A of the connection terminal 132 is exposed from a first surface 130A of the insulator layer 130, and a diameter of the connection terminal 132 gradually decreases in a direction that separates more from the first surface 132A. The conductor layer 120 is exposed from a second surface 130B of the insulator layer 130, located on an opposite side from the first surface 130A. The second surface 130B is covered by the thin foil 113, and the conductor layer 120 contacts the thin foil 113. For example, a metal such as copper or the like, may be used as a material forming the conductor layer 120 and the thin foil 113.

[Method of Manufacturing Semiconductor Package Using Wiring Board]

Figure 2A:
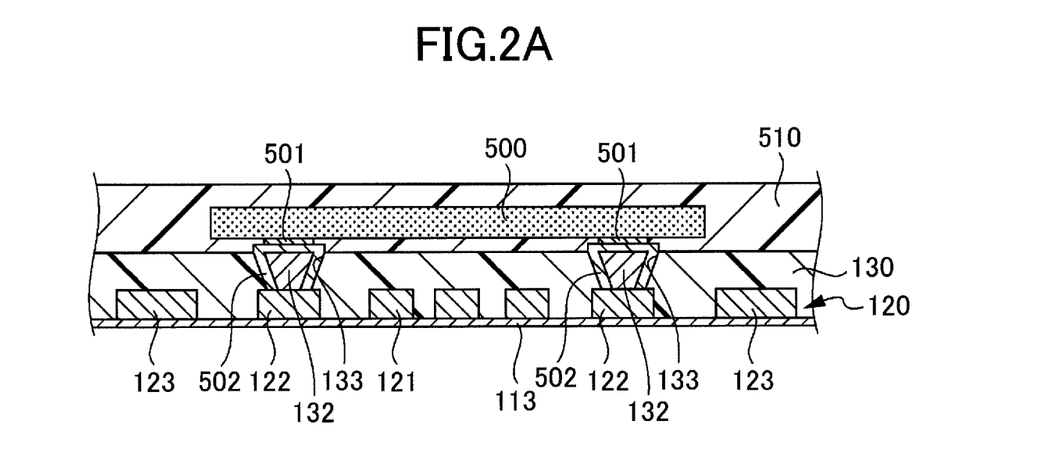
FIG. 2A and FIG. 2B are cross sectional views for explaining a method of manufacturing a semiconductor package using the wiring board in the first embodiment.
Figure 2B:
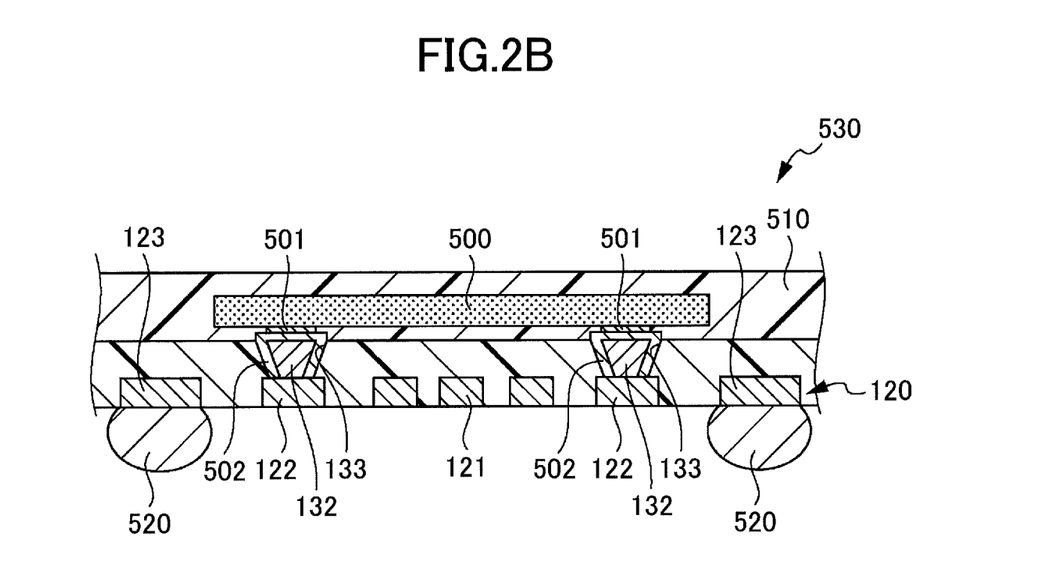

Next, a method of manufacturing a semiconductor package using the wiring board 100 will be described. FIG. 2A and FIG. 2B are cross sectional views for explaining the method of manufacturing the semiconductor package using the wiring board 100 in the first embodiment.

First, a semiconductor chip 500 having electrode pads 501 is prepared, and a reflow is performed by interposing solder balls between the electrode pads 501 and the connection terminals 132. As a result, as illustrated in FIG. 2A, the solder balls melt, and a part of the melted solder balls flows into the gaps 133 and solidifies, to form a solder layer 502 that covers the first surface 132A and the side surface of the connection terminals 132. In addition, the solder layer 502 bonds the connection terminals 132 and the electrode pads 501. Next, the semiconductor chip 500 is encapsulated by an encapsulating resin 510 such as an epoxy resin or the like. An electronic component (or electronic part), such as a capacitor, a resistor, or the like, may be mounted in place of the semiconductor chip 500.

Thereafter, as illustrated in FIG. 2B, the thin foil 113 is removed, and solder balls 520 are provided on the conductive pads 123. Examples of materials that may be used for the solder balls 502 and the solder layer 502 include lead-free solders made of a tin-silver (SnAg) alloy, a tin-zinc (SnZn) alloy, a tin-copper (SnCu) alloy or the like, and leaded (or lead) solders made of a lead-tin (PbSn) alloy or the like.

A semiconductor package 530 can be manufactured as described above. The semiconductor package 530 is an example of the semiconductor device.

Figure 3A:
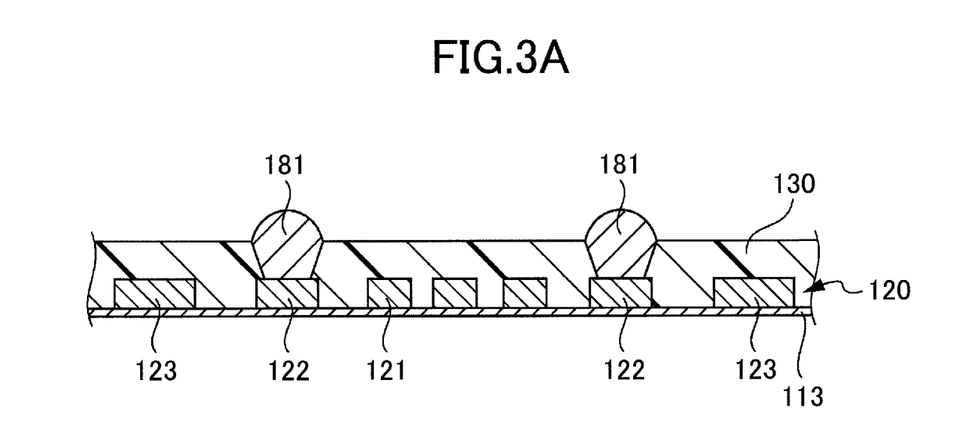
FIG. 3A and FIG. 3B are cross sectional views illustrating reference examples of the wiring board.
Figure 3B:
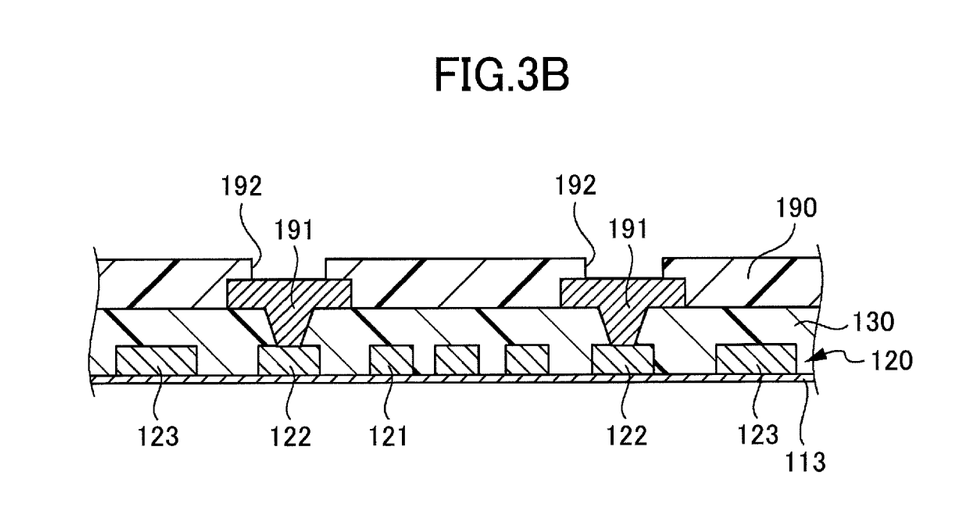

Effects obtainable by the wiring board 100 in this embodiment will be described, in comparison with two reference examples. FIG. 3A and FIG. 3B are cross sectional views illustrating the reference examples of the wiring board.

The first reference example illustrated in FIG. 3A includes no connection terminals 132, and solder bumps 181 are provided on the connecting parts 122. Compared to the first reference example, a bonding area (or contact area) between the solder and copper after the semiconductor chip is mounted is large for the wiring board 100. In addition, when a load acts in a pull direction to pull out the semiconductor chip, the solder bumps 181 and the connecting parts 122 make contact only at surfaces perpendicular to the pull direction in the case of the first reference example. On the other hand, in the case of the wiring board 100, the solder layer 502 is provided along the side surface of the connection terminals 132 and reaches a backside of the first surface 132A of the connection terminals 132, as illustrated in FIG. 2A. For this reason, the connection terminals 132 obstructs separation of the solder layer 502, and further, the semiconductor chip uneasily separates. Accordingly, the wiring board 100 is more advantageous than the first reference example from a viewpoint of the mechanical strength of the wiring board 100. In addition, because a conductivity of copper is considerably higher than a conductivity of solder, the wiring board 100 is more advantageous than the first reference example also from a viewpoint of a resistance of a current path.

The second reference example illustrated in FIG. 3B includes a wiring layer 191, that connects to the connecting parts 122, formed on the insulator layer 130, and a solder resist layer 190 that is formed to cover the wiring layer 191. Openings 192 that expose a part of the wiring layer 191 are formed in the solder resist layer 190. Compared to the second reference example, the wiring board 100 is more advantageous than the second reference example from a viewpoint of the thickness that is small for the wiring board 100, because the second reference example is thicker by an amount corresponding to the solder resist layer 190. In addition, in the case of the second reference example, processes such as coating, exposing, developing, curing, or the like are required with respect to forming the solder resist layer 190 when manufacturing the wiring board. Hence, the wiring board 100 is more advantageous than the second reference example from a viewpoint of the number of steps and the cost required to manufacture the wiring board 100.

[Method of Manufacturing Wiring Board]

Next, a method of manufacturing the wiring board will be described. FIG. 4A through FIG. 4D, and FIG. 5A through FIG. 5C are cross sectional views illustrating the method of manufacturing the wiring board in the first embodiment.

Figure 4A:
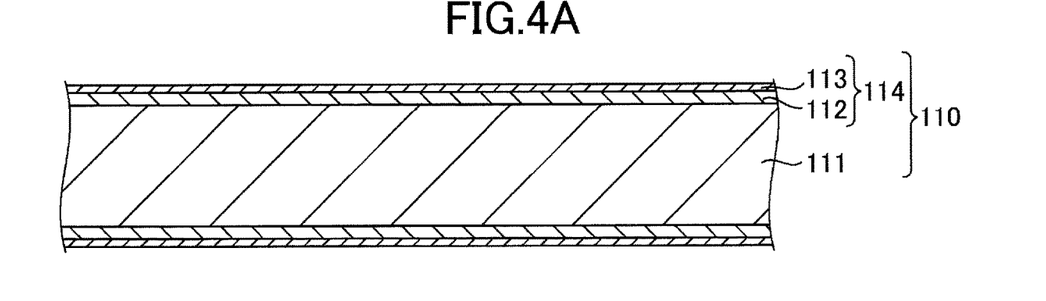
FIG. 4A, FIG. 4B, FIG. 4C, and FIG. 4D are cross sectional views illustrating a method of manufacturing the wiring board in the first embodiment.

First, as illustrated in FIG. 4A, a support 110, having each outermost layer that is a metal foil, is prepared. For example, a prepreg 111 having a metal foil 114 with carrier stacked on both surfaces thereof, may be used for the support 110. The support 110 may have a thickness of approximately 18 μm to approximately 100 μm, for example.

The prepreg 111 includes a non-woven cloth or woven cloth (not illustrated) such as glass fiber, aramid fiber or the like, impregnated with an insulator resin such as an epoxy resin or the like, for example. The metal foil 114 with carrier, includes the thin foil 113 that is peelably (or removably) adhered on a thick foil (carrier foil) 112 via a peel layer (not illustrated). The thin foil 113 is formed by a metal foil made of copper or the like, and has a thickness of approximately 1.5 μm to approximately 5 μm, for example. The thick foil 112 is formed by a metal foil made of copper or the like, and has a thickness of approximately 10 μm to approximately 50 μm, for example. The thick foil 112 is provided as a base material to facilitate handling of the thin foil 113. A lower surface of the thick foil 112 is adhered to an upper surface of the prepreg 111.

As illustrated in FIG. 4A, the metal foil 114 with carrier is provided on both upper and lower surfaces of the support 110. Processes performed hereinafter are performed on each of the two metal foils 114 with carrier. However, in FIG. 4B and subsequent figures, only one of the two metal foils 114 with carrier are illustrated for the sake of convenience.

Figure 4B:
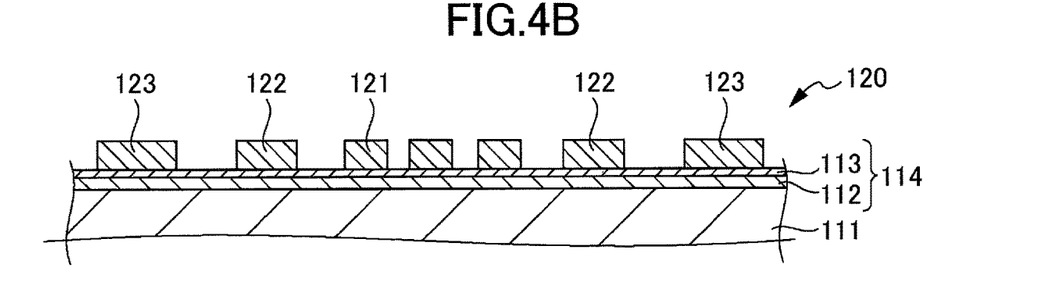

After the support 110 is prepared, a conductor layer 120 that includes the micro wirings 121, the connecting parts 122, and the conductive pads 123, is formed on an upper surface of the thin foil 113 of the support 110, as illustrated in FIG. 4B. More particularly, a resist layer (dry film resist or the like) that has an opening at a part where the conductor layer 120 is to be formed, is formed on the upper surface of the thin foil 113 of the support 110, for example. Then, an electroplating is performed using the metal foil 114 with carrier as a plating power feed layer, to deposit copper or the like on the upper surface of the thin foil 113 that is exposed within the opening in the resist layer and form the conductor layer 120. Thereafter, a stripping solution (or remover) is used to remove the resist layer, so that the conductor layer 120 that includes the micro wirings 121, the connecting parts 122, and the conductive pads 123, is formed on the upper surface of the thin foil 113 of the support 110.

Figure 4C:
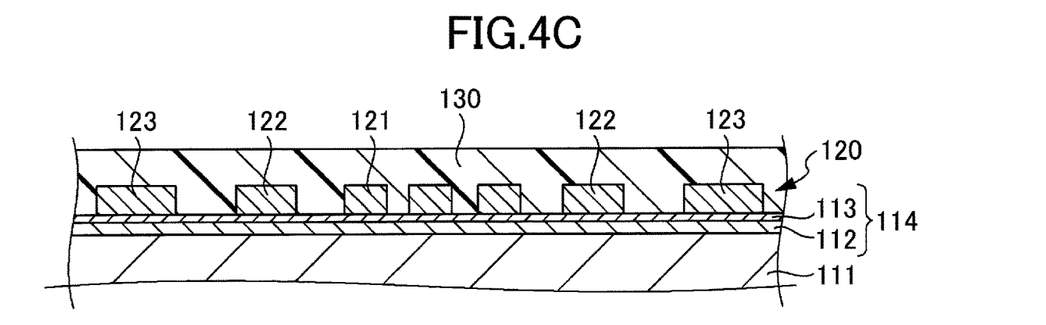

Thereafter, as illustrated in FIG. 4C, the insulator layer 130 that covers the conductor layer 120 is formed on the thin foil 113. As described above, the thermosetting non-photosensitive resin or the thermosetting photosensitive resin, for example, may be used as the material forming the insulator layer 130.

Figure 4D:
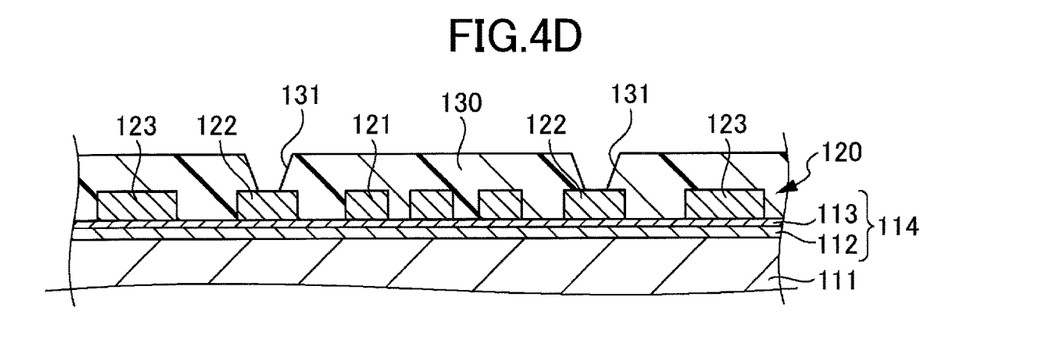

Next, as illustrated in FIG. 4D, via holes 131, that reach the connecting parts 122, are formed in the insulator layer 130 by laser beam irradiation. Then, residual of the insulator layer 130 adhered on the connecting parts 122 exposed within the via holes 131 is removed by a desmear process, and a surface of the connecting parts 122 and an inner surface of the via holes 131 are roughened by a roughening treatment.

Figure 5A:
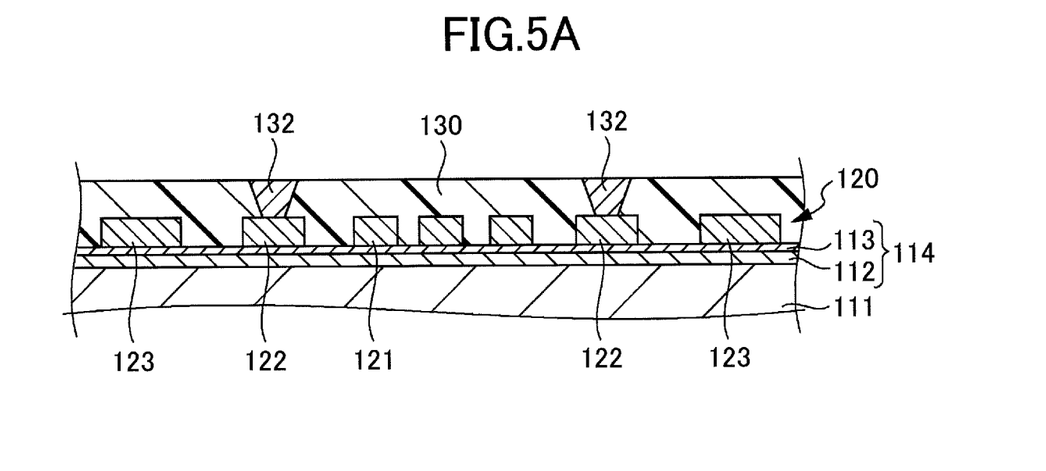
FIG. 5A, FIG. 5B, and FIG. 5C are cross sectional views illustrating the method of manufacturing the wiring board in the first embodiment.

Thereafter, as illustrated in FIG. 5A, the connection terminals 132 are formed on the connecting parts 122 within the via holes 131. For example, the connection terminals 132 may be formed by electroplating using the metal foil 114 with carrier as the plating power feed layer. The connection terminals 132 need only be formed within the via holes 131, and do not need to be formed to a location on the insulator layer 130. For this reason, it is unnecessary to form a seed layer, a plating resist pattern, or the like when forming the connection terminals 132.

Figure 5B:
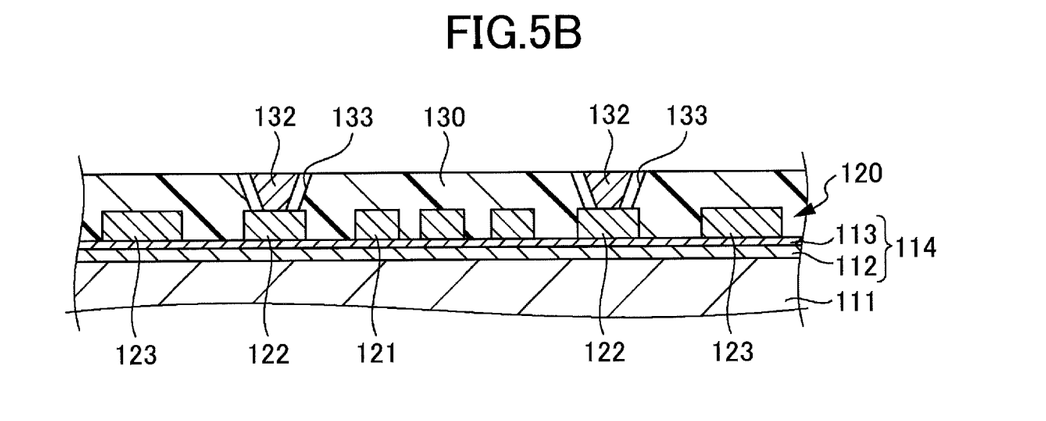

Next, the gap 133 is formed along the side surface of each connection terminal 132, as illustrated in FIG. 5B, by laser beam irradiation to a periphery of each connection terminal 132. Of course, the gap 133 may be formed by a plasma process or the like.

Figure 5C:
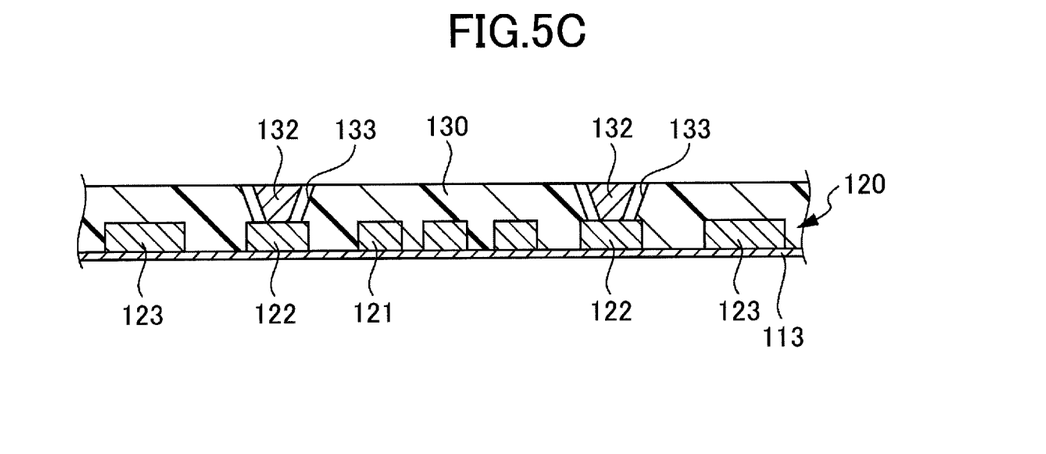

Next, as illustrated in FIG. 5C, a part of the support 110 is removed from the structure illustrated in FIG. 5B. More particularly, a mechanical force is applied to the support 110, to separate an interface between the thick foil 112 and the thin foil 113 of the metal foil 114 with carrier. As described above, the metal foil 114 with carrier has a structure in which the thick foil 112 is adhered on the thin foil 113 via the peel layer (not illustrated). For this reason, the thick foil 112, together with the peel layer (not illustrated), can easily be peeled (or removed) from the thin foil 113.

Accordingly, only the thin foil 113 remains on the side of the insulator layer 130, and other parts (prepreg 111 and thick foil 112) forming the support 110 are removed. In addition to the case in which the thick foil 112, together with the peel layer, is peeled off from the thin foil 113, there are cases in which a cohesion failure occurs within the peel layer such that the thick foil 112 is peeled off from the thin foil 113. Further, there are cases in which the thick foil 112 is peeled off from the peel layer such that the thick foil 112 is peeled off from the thin foil 113.

The wiring board 100 in the first embodiment can be manufactured by the processes described above.

Second Embodiment

Figure 6:
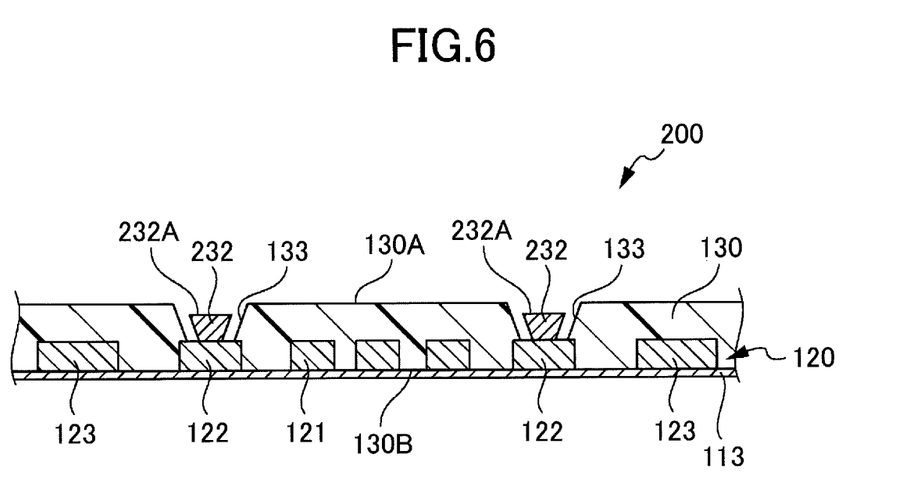
FIG. 6 is a cross sectional view illustrating the wiring board in a second embodiment.

Next, a second embodiment will be described. The second embodiment relates to the wiring board. FIG. 6 is a cross sectional view illustrating the wiring board in the second embodiment.

As illustrated in FIG. 6, a wiring board 200 in the second embodiment includes connection terminals 232 in place of the connection terminals 132. While the first surface 132A of the connection terminal 132 is located substantially on the same plane as the first surface 130A of the insulator layer 130, a first surface 232A of the connection terminal 232 is located at a position deeper than the first surface 130A of the insulator layer 130. In other words, the first surface 232A is receded from the first surface 130A, and a cavity is formed on an inner side of the gap 133. The structure of other parts of the wiring board 200 in the second embodiment may be the same as the structure of the wiring board 100 in the first embodiment.

The wiring board 200 in the second embodiment can also obtain effects similar to the effects obtainable by the wiring board 100 in the first embodiment. Further, because the first surface 232A of the connection terminals 232 is located at the position deeper than the first surface 130A of the insulator layer 130, a positional error of the solder balls on the connection terminals 232 uneasily occurs when mounting the electronic component such as the semiconductor chip or the like. In addition, compared to the wiring board 100 in the first embodiment, the wiring board 200 in the second embodiment can reduce the thickness of the semiconductor device after the mounting of the electronic component.

The connection terminals 232 may be formed by electroplating using the metal foil 114 with carrier as the plating power feed layer, similarly to forming the connection terminals 132. The deposition of the plated layer by the electroplating that forms the connection terminals 232 may be stopped before the plated layer fills the via holes 131.

Third Embodiment

Figure 7:
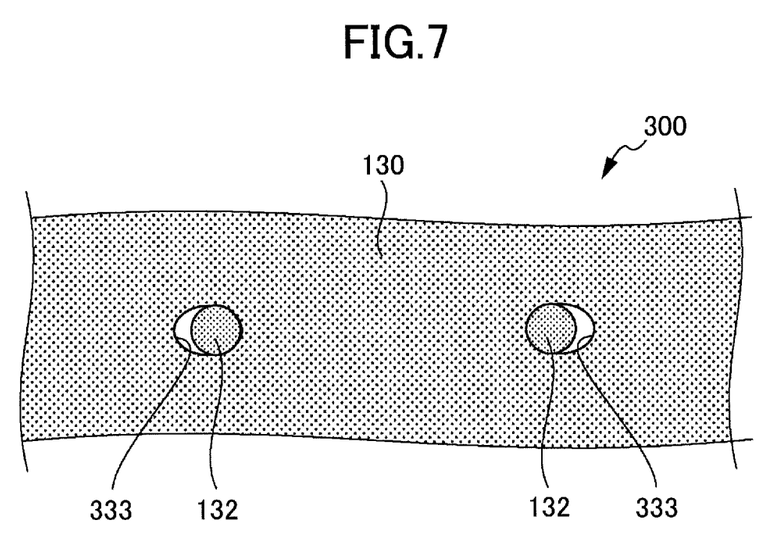
FIG. 7 is a plan view illustrating the wiring board in a third embodiment.

Next, a third embodiment will be described. The third embodiment relates to the wiring board. FIG. 7 is a plan view illustrating the wiring board in the third embodiment.

As illustrated in FIG. 7, the insulator layer 130 of a wiring board 300 in the third embodiment includes gaps (or spaces) 333 in place of the gaps 133. While the gap 133 is formed around the entire periphery of the side surface of the connection terminal 132, the gap 333 is only formed around a part of the side surface of the connection terminal 132. For example, the gap 333 is formed at positions avoiding positions between two mutually adjacent connection terminals 132. The structure of other parts of the wiring board 300 in the third embodiment may be the same as the structure of the wiring board 100 in the first embodiment.

The wiring board 300 in the third embodiment can also obtain effects similar to the effects obtainable by the wiring board 100 in the first embodiment. Further, in the plan view, the gap 333 at one of the two mutually adjacent connection terminals 132 is hidden from the other of the two mutually adjacent connection terminals 132, and vice versa. For this reason, the solder layer 502 at the gap 333 of one of the two mutually adjacent connection terminals 132 uneasily flows into the gap 333 of the other of the two mutually adjacent connection terminals 132, and vice versa, when mounting the electronic component such as the semiconductor chip or the like.

The gaps 333 may be formed by laser beam irradiation, similarly to forming the gaps 133, by simply adjusting the positions where the laser beam is irradiated.

Modification

Figure 8:
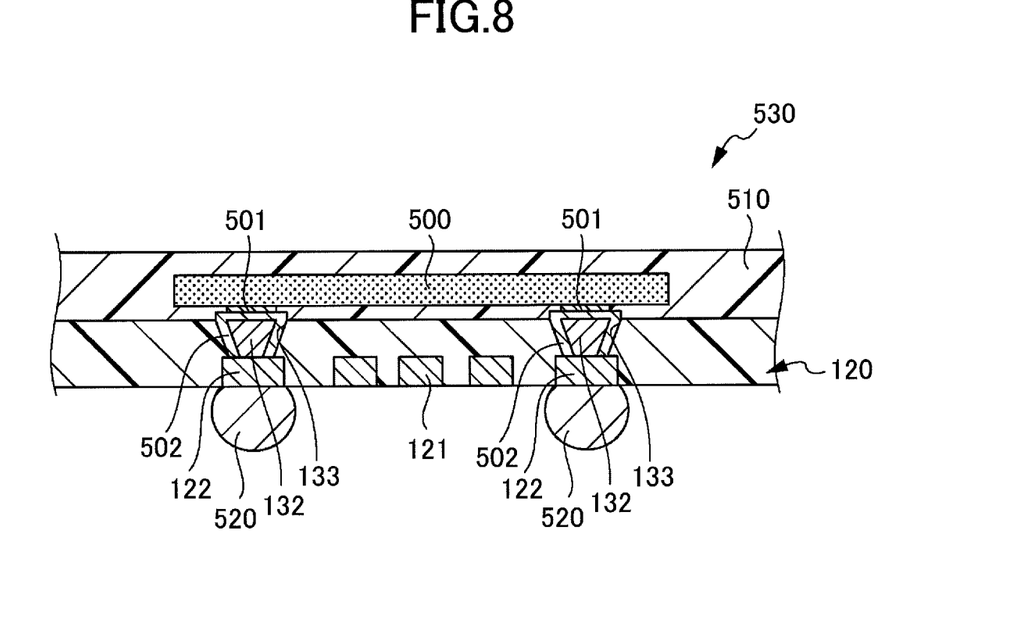
FIG. 8 is a cross sectional view illustrating a modification of the first embodiment.

The connection parts 122 and the conductive pads 123 need not be provided separately on the conductor layer 120. As illustrated in FIG. 8, the connection parts 122 may be used in common as the conductive pads, and the solder balls 520 may be provided on the connection parts 122. FIG. 8 is a cross sectional view illustrating a modification of the first embodiment. Although FIG. 8 illustrates the modification of the first embodiment, this modification may be similarly applied to each of the second and third embodiments described above.

According to each of the embodiments and the modification described above, it is possible to provide a wiring board, a semiconductor device, and a method of manufacturing the wiring board, which can shrink the wiring board and the semiconductor device while maintaining satisfactory conductivity and mechanical strength.

Various aspects of the subject-matter described herein may be set out non-exhaustively in the following numbered clauses:

1. A method of manufacturing a wiring board, comprising:
   forming a via hole in an insulator layer;
   forming a connection terminal, having a first surface and a side surface intersecting the first surface, within the via hole to expose the first surface from the insulator layer; and
   forming a gap in the insulator layer along at least a part of the side surface.
2. The method of manufacturing the wiring board according to clause 1, wherein the forming the gap forms the gap by laser beam irradiation.
3. The method of manufacturing the wiring board according to clause 1, wherein the forming the gap forms the gap around an entire periphery of the side surface.
4. The method of manufacturing the wiring board according to clause 1, wherein the forming the connection terminal forms the connection terminal so that a diameter of the connection terminal gradually decreases in a direction that separates more from the first surface.
5. The method of manufacturing the wiring board according to clause 1, wherein the forming the connection terminal forms the connection terminal so that the first surface is located at a position deeper than a surface of the insulator layer.
6. The method of manufacturing the wiring board according to clause 1, further comprising:
   forming a conductor layer within the insulator layer and connected to the connection terminal,
   wherein the forming the conductor layer exposes the conductor layer from a surface of the insulator layer located on an opposite side from a surface of the insulator layer exposing the connection terminal.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   an insulator layer; and
   a connection terminal having a first surface, and a side surface intersecting the first surface,
   wherein the first surface is exposed from the insulator layer,
   the insulator layer includes a gap formed along at least a part of the side surface, and
   a diameter of the connection terminal gradually decreases in a direction that separates more from the first surface.
2. The wiring board as claimed in claim 1, wherein the gap is formed around an entire periphery of the side surface.
3. The wiring board as claimed in claim 1, wherein
   the insulator layer has a second surface, and a third surface located on an opposite side from the second surface,
   the first surface is exposed from the second surface, and
   a height position of the first surface from the third surface is lower than a height position of the second surface from the third surface.
4. A wiring board comprising:
   an insulator layer,
   a connection terminal having a first surface, and a side surface intersecting the first surface, and
   a conductor layer provided within the insulator layer and connected to the connection terminal,
   wherein the first surface is exposed from a second surface of the insulator layer,
   the insulator layer includes a gap formed along at least a part of the side surface, and
   wherein the conductor layer is exposed from a third surface of the insulator layer located on an opposite side from the second surface.
5. A semiconductor device comprising:
   a wiring board including
      an insulator layer, and
      a connection terminal having a first surface, and a side surface intersecting the first surface,
      wherein the first surface is exposed from the insulator layer, and the insulator layer includes a gap formed along at least a part of the side surface; and
   a semiconductor chip mounted on the wiring board,
   wherein the semiconductor chip includes an electrode pad connected to the connection terminal.
6. The semiconductor device as claimed in claim 5, wherein the gap is formed around an entire periphery of the side surface of the connection terminal.
7. The semiconductor device as claimed in claim 5, wherein a diameter of the connection terminal gradually decreases in a direction that separates more from the first surface of the connection terminal.
8. The semiconductor device as claimed in claim 5, wherein
   the insulator layer has a second surface, and a third surface located on an opposite side from the second surface,
   the first surface is exposed from the second surface, and
   a height position of the first surface from the third surface is lower than a height position of the second surface from the third surface.
9. The semiconductor device as claimed in claim 5, wherein
   the insulator layer has a second surface exposing the connection terminal, and a third surface located on an opposite side from the second surface,
   the wiring board further includes a conductor layer provided within the insulator layer and connected to the connection terminal, and
   the conductor layer is exposed from the third surface.

* * * * *